(12) United States Patent
Raths Ponce et al.

(10) Patent No.: US 10,444,097 B2
(45) Date of Patent: Oct. 15, 2019

(54) MAGNETOELASTIC TORQUE SENSOR THAT MORE ACCURATELY MEASURES MAGNETIC FIELD CHANGE

(71) Applicant: NCTE AG, Oberhaching (DE)

(72) Inventors: Carlos Raths Ponce, München (DE); Florian Eckschlager, Riemerling (DE)

(73) Assignee: NCTE AG, Oberhaching (DE)

( * ) Notice: Subject to any disclaimer, the term of this patent is extended or adjusted under 35 U.S.C. 154(b) by 8 days.

(21) Appl. No.: 15/895,215

(22) Filed: Feb. 13, 2018

(65) Prior Publication Data

US 2018/0231425 A1    Aug. 16, 2018

(30) Foreign Application Priority Data

Feb. 15, 2017 (EP) .................................. 17156202

(51) Int. Cl.
| | | |
|---|---|---|
| *G01L 3/10* | (2006.01) | |
| *G01R 33/09* | (2006.01) | |
| *H01L 41/12* | (2006.01) | |

(52) U.S. Cl.
CPC .............. *G01L 3/105* (2013.01); *G01L 3/102* (2013.01); *G01R 33/096* (2013.01); *H01L 41/125* (2013.01)

(58) Field of Classification Search
CPC ....... G01L 3/102; G01L 3/105; G01R 33/096; H01L 41/125
USPC ..................... 73/862.331–862.338
See application file for complete search history.

(56) References Cited

U.S. PATENT DOCUMENTS

| | | | | |
|---|---|---|---|---|
| 6,826,969 | B1 * | 12/2004 | May ...................... | G01L 3/105 |
| | | | | 73/862.331 |
| 7,358,722 | B2 * | 4/2008 | Peczalski ............... | B82Y 25/00 |
| | | | | 324/247 |
| 2012/0296577 | A1 * | 11/2012 | Garshelis ................ | G01L 1/125 |
| | | | | 702/42 |
| 2017/0276556 | A1 | 9/2017 | Neuschaefer-Rube | |

FOREIGN PATENT DOCUMENTS

| | | | |
|---|---|---|---|
| CN | 102830373 | * | 12/2012 |
| DE | 69838904 T2 | | 1/2009 |
| DE | 102014219336 | * | 1/2016 |
| DE | 102014219336 B3 | | 1/2016 |
| EP | 2878938 A1 | | 11/2013 |
| WO | 9921150 A2 | | 4/1999 |

OTHER PUBLICATIONS

European Patent Office Search Report dated Aug. 22, 2017, pp. 1-12, for EP application 17156202.8 filed Feb. 15, 2017.

* cited by examiner

*Primary Examiner* — Octavia Hollington
(74) *Attorney, Agent, or Firm* — Coats + Bennett, PLLC

(57) ABSTRACT

The magnetoelastic torque sensor includes a shaft that is magnetized in a first axial section in a first circumferential direction and to which a torque to be measured can be applied; a first magnetic field sensor outside of the shaft for recording a magnetic field, which is generated by the first section of the shaft and independent of the applied torque. The first magnetic field sensor comprises a first 3D Anisotropic MagnetoResistance (3D-AMR) sensor.

12 Claims, 1 Drawing Sheet

MAGNETOELASTIC TORQUE SENSOR THAT MORE ACCURATELY MEASURES MAGNETIC FIELD CHANGE

This application claims the benefit under 35 USC § 119 of EP 17156202.8, filed 15 Feb. 2017, the disclosure of which is incorporated herein by reference in its entirety.

FIELD OF THE INVENTION

The present disclosure relates to a magnetoelastic torque sensor and a method for determining a torque, which is applied to a shaft, with a magnetoelastic torque sensor.

BACKGROUND

The use of measuring coils is state of the art for measuring a magnetic field change due to torque on the basis of magnetostriction. The coils are installed in a contactless way in relation to a magnetically coded measuring shaft (in parallel to the rotary axis) and record magnetic field changes that occur due to the magnetoelastic effect under load (inverse magnetostriction). The magnetic field change is directly proportional to the external force impact and establishes the link to the torque.

Recording of a twisting angle is state of the art for torque measurements by means of Anisotropic MagnetoResistance (AMR) sensors. An AMR sensor is a magnetic field sensor that can measure the magnetic field strength based on the anisotropic magnetoresistive effect (AMR effect). At an end of the torsion track over which the torque is to be measured, a magnetic multipole ring, which is located opposite to an AMR sensor, is installed. Twisting of the torsion track leads to a movement of the multipole ring in relation to the AMR sensor, wherein the direction of the magnetic field at the location of the sensor changes. Out of this connection between the twisting angle and the magnetic angle, the torque is subsequently determined.

The currently used methods, however, come with some disadvantages. Measurement coils only have a sensitive axis because they can only measure magnetic field changes along their longitudinal axis. Magnetic field changes in other directions can therefore not be recorded. In this process, for example additional information about the external force impact or an external magnetic field are getting lost. In case of torque measurement by means of AMR sensors, the pole ring has to be coupled with the shaft, which is structurally complex.

In view of these disadvantages, the present disclosure has the purpose of providing a method that allows for better recording of magnetic field changes and a more accurate conversion into torque and/or that constitutes a structural simplification.

SUMMARY

The present disclosure is based on the problem of eliminating the mentioned disadvantages, at least partially.

The magnetoelastic torque sensor according to the present disclosure comprises a shaft that is magnetized in a first axial section in a first circumferential direction and onto which a torque to be measured can be applied; a first magnetic field sensor for recording of a magnetic field, which is generated by the first section of the shaft and which depends on the applied torque, outside of the shaft; and is characterized in that the first magnetic field sensor comprises a first 3D-AMR sensor.

For the magnetoelastic torque sensor, the advantage of using a 3D-AMR sensor consists in that an external magnetic field change, which is caused by a torque applied to the shaft, can be measured more accurately with the 3D-AMR sensor than with a sensor that is only sensitive for the magnetic field in the direction of the shaft axis (coil). The exact measurement of the magnetic field in 3D leads to a higher accuracy in determining the applied torque. Further, there will also be an installation space reduction compared to the coil or pole ring implementation.

The shaft can be a solid or a hollow shaft.

A further development of the torque sensor according to the present disclosure consists in that the shaft has a second axial section that is magnetized in a second circumferential direction that is opposed to the first circumferential direction. The torque sensor further comprises a second magnetic field sensor for recording a magnetic field, which is generated by the second section of the shaft and which depends on the applied torque, outside of the shaft, wherein the second magnetic field sensor comprises a second 3D-AMR sensor.

This way, the accuracy can be increased further, and in particular interfering magnetic fields, which are constant and independent of the applied torque, can be compensated/deducted.

According to another further development, one or multiple magnetized shaft sections with one or multiple 3D-AMR sensors can be provided.

According to another further development, the first 3D-AMR sensor and/or the second 3D-AMR sensor and/or each further 3D-AMR sensor and/or a respective 3D-AMR sensor board can be held by means of a plastic holder. This reduces the interfering magnetic fields that would for example be generated by the Earth's magnetic field through magnetization of a ferromagnetic holder. Alternatively, the sensor(s) can also be held on a metallic holder.

The magnetic field strengths to be measured by the 3D-AMR sensor and/or the 3D-AMR sensors can in particular be in the range of ±10 mT, ±3 mT, ±1 mT, ±300 µT, or ±100 µT. Therefore, the magnetoresistive torque sensor according to the present disclosure can be operated with a low magnetization of the shaft that only causes low measurement field strengths. For comparison: the field strength of the Earth's magnetic field in Central Europe is approximately 50 µT.

Another further development consists in that an evaluation unit can further be provided, which is formed to receive sensor signals from the 3D-AMR sensor(s) and to identify a torque applied to the shaft out of the received sensor signals.

The evaluation unit can further be formed to compensate the impact of an external interfering magnetic field on the determining of the torque out of the signals from the first and second 3D-AMR sensor, in particular in real time in case of a change of the interfering magnetic field and/or measurement value deviations due to a rotation asymmetry of the magnetized sections of the shaft during a rotation of the shaft around its longitudinal axis.

The external interfering magnetic field can be the Earth's magnetic field and/or a magnetic field that is generated through a magnetization of the shaft that is caused by the Earth's magnetic field and/or a magnetic field that is generated by a permanent magnet close to the 3D-AMR sensor.

Through computation using the information (magnetic field strengths), which is obtained out of the 3 axes x, y, z of the 3D-AMR sensor, additional information can be obtained that can be used for compensating the RSU (Rotational Signal Uniformity). The RSU indicates the signal change that occurs when a shaft is rotated around the longitudinal axis by 360°. This signal change can be explained with a non-ideal magnetization of the axial area in the circumferential direction, which leads to a rotation asymmetry of the sensor signals during a rotation of the shaft around the shaft axis. In case of an ideal magnetization, the measured magnetic field and hence the sensor signal would be independent of the angular position of the shaft and depend only on the applied torque.

This way, also influences of a ferromagnetic material (e.g. a sensor housing) can be compensated alternatively or in addition.

In another further development, the evaluation unit can comprise a data memory in which a link between the measured magnetic field and the torque applied to the shaft is saved.

There, the link can be saved as a tabular connection or a functional link. For this purpose, the torque sensor was possibly calibrated prior to commissioning by measuring the corresponding magnetic field strengths for a known torque. The functional link can for example be a linear function that depicts the measured magnetic field onto the applied torque.

The abovementioned problem is also solved by a method according to claim 10.

The method according to the present disclosure is suitable for identifying a torque that is applied to a shaft, wherein the shaft is magnetized in a first axial section in a first circumferential direction and a first 3D-AMR sensor is provided, wherein the method comprises the following steps: applying a torque to the shaft; recording of a magnetic field, which is generated by the first section of the shaft, by means of the first 3D-AMR sensor; identifying the applied torque out of the magnetic field recorded by the first 3D-AMR sensor.

The method according to the present disclosure can be developed further in a way that the shaft is magnetized in a second axial section in a second circumferential direction that is opposed to the first circumferential direction, and that a second 3D-AMR sensor is provided, wherein the method comprises the following steps: recording of a magnetic field, which was generated by the second section of the shaft, with the second 3D-AMR sensor; determining the applied torque out of the magnetic field recorded by the first 3D-AMR sensor and out of the magnetic field recorded by the second 3D-AMR sensor.

In this context, the determining of the applied torque can comprise a correction of a measurement error due to a magnetic field, in particular the Earth's magnetic field, that is recorded by both 3D-AMR sensors and that is independent of the torque.

Correction preferably takes place during each determination process of the applied torque in order to implement the correction in particular in case of a change of the magnetic field that is independent of the torque.

The mentioned further developments can be used individually or, as claimed, be combined with one another in a suitable way.

Further features and exemplary embodiments as well as advantages of the present disclosure will be explained in greater detail by means of the drawings in the following. It is clear that the embodiments do not exhaust the field of the present disclosure. It is further clear that some or all of the features described in the following can also be combined with one another in a different way.

DESCRIPTION

The present disclosure relates to a structure for magnetoelastic measurement of torque, which is composed of a magnetically coded shaft, one or two 3D-AMR sensors and a housing on which the sensors are installed. The present disclosure further relates to a method for magnetoelastic measurement of torque. For the measurement, the primary measurement variable, the torque, is transformed into a change of the magnetic field through magnetic coding of the shaft. This magnetic field change will then be measured by means of AMR sensors, and algorithms, which are implemented in software, will be used to draw conclusions on the torque.

Through the measurement with 3D-AMR sensors, which have 3 sensitive axes, the magnetic field change under torque can be recorded in 3 directions. In the preferred embodiment, two 3D-AMR sensors are used, which are installed together with the evaluation electronics on a housing in relation to the magnetic fields of the measuring shaft.

Such a magnetoelastic torque sensor is based on a reversal of the physical effect of magnetostriction (deformation of magnetic materials by means of an applied magnetic field), wherein a torque, which impacts on the magnetized shaft, causes a torsion of the shaft and as a consequence a modification of the magnetic field outside of the shaft. This modification is very sensitive with regard to the extent of the torque and can be measured with the magnetic field sensor.

An AMR sensor is a magnetic field sensor that can measure the magnetic field strength based on the anisotropic magnetoresistive effect (AMR effect). In this context, a dependence of the electrical resistance on the angle between the current direction and the magnetization in the plane of the AMR layer of the AMR sensor is taken advantage of. Under the influence of an external magnetic field, the direction of the magnetization in the AMR layer changes. This modification is used for measuring the external magnetic field. In case of the 3D-AMR sensor used here, multiple AMR layers are arranged and interconnected in such a way that the magnetic field is also measured in the third dimension that is perpendicular to the layers. Therefore, the strength of the external magnetic field can be measured in 3D.

Figure 1:
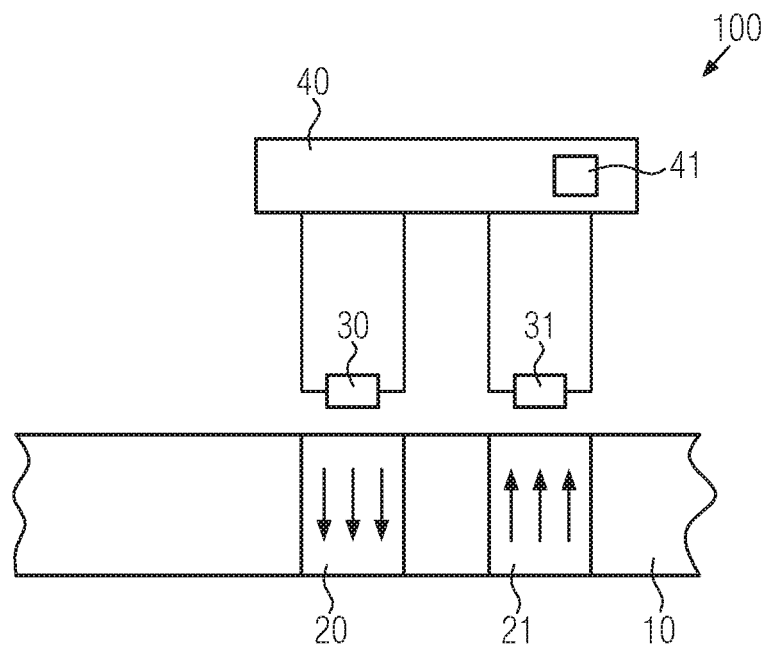
FIG. 1 shows an embodiment of the torque sensor according to the present disclosure.

FIG. 1 shows an embodiment 100 of the torque sensors according to the present disclosure. The torque sensor 100 according to the present disclosure comprises in this embodiment a shaft 10 that is magnetized in a first axial section 20 in a first circumferential direction and on which a torque to be measured can be applied; a first 3D-AMR sensor 30 for recording a magnetic field, which is generated by the first section 20 of the shaft 10 and which is dependent on the applied torque, outside of the shaft 10.

The shaft 10 has a second axial section 21 that is magnetized in a second circumferential direction that is opposed to the first circumferential direction. In addition, the torque sensor 100 further comprises a second 3D-AMR sensor 31 for recording a magnetic field, which is generated by the second section 21 of the shaft and which is dependent on the applied torque, outside of the shaft 10.

A torque to be measured can be applied to the shaft 10. The signals from the 3D-AMR sensors are led to an evaluation unit 40 that determines the extent of the applied torque based on the measured magnetic field strengths. For this purpose, a data memory 41, in which a predetermined link between the measured magnetic field strength and the applied torque is saved, is included in the evaluation unit.

Figure 2:
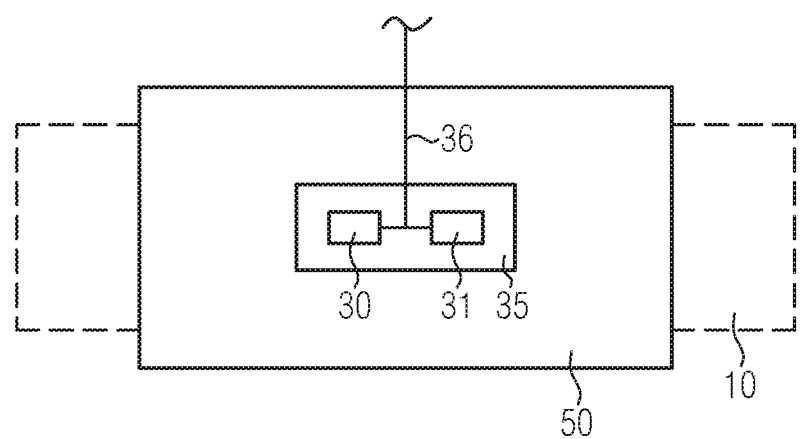
FIG. 2 shows a section of a second embodiment of the torque sensor according to the present disclosure.

FIG. 2 shows a section of a second embodiment of the torque sensor according to the present disclosure. The difference to the first embodiment consists in that the 3D-AMR sensors are arranged jointly on a board 35 that, in turn, is held in a housing 50 (e.g., a plastic housing 50). Due to the use of plastic, the influence of interfering magnetic fields is reduced and/or eliminated because of a housing magnetization. Signal lines 36 lead from the board 35 through the housing 50 to the evaluation unit 40. The shaft 10 is only indicated by a dashed line in FIG. 2.

Fields of use of the torque sensors according to the present disclosure are listed exemplarily in the following:

E-bike sensors (one-sided measurement, double-sided in the bottom bracket, integrated in customer-specific solution for mid-mounted motors, rear drive, or other drives);

Torque sensors for test facilities in general (e-motor test facilities, special applications for high-speed shafts);

Robotic applications for measuring the torque in driven joints;

Medical engineering (force measurement on load cardans) and load measurement bolts for off-highway vehicles with cantilevers;

Wind energy (sensors for pitch and azimuth adjustment);

Agricultural engineering (drive in and output, besides drives and downforces);

Motor sports (measurement on joint shafts, drive input and output, measurement in hollow shafts, measurement in the releaser bearing);

Extruder (measurement of the torque in front of the extrusion screws);

Straightening machines (recording of overload of the gearboxes and shaft packages);

Aviation (drive in- and output, actuators, drive shaft fan and propshaft).

In this context, the advantages of the solution according to the present disclosure are respectively the accuracy of the torque measurement, in particular due to the correction of the influences of interfering fields, and the small size of the required installation space. Further advantages are:

Lower energy consumption: due to the lower energy consumption, new fields of application, e.g. bottom bracket unit for performance measurement, are possible.

These could for example be formed as a retrofit solution with a small battery ("button cell") and a wireless data transmission system;

Greater robustness, because SMD construction elements (surface-mounted construction elements) can be used;

Lower system complexity with regard to the electronic interconnection and the number of components.

The displayed embodiments are only exemplary and the complete scope of the present invention is defined by the claims.

What is claimed is:

1. A magnetoelastic torque sensor, comprising:

a shaft that is magnetized in a first axial section in a first circumferential direction, and to which a torque to be measured can be applied; wherein the shaft has a second axial section that is magnetized in a second circumferential direction that is opposed to the first circumferential direction;

a first magnetic field sensor disposed outside of the shaft, the first magnetic field sensor configured to record a magnetic field which is generated by the first section of the shaft and which is dependent on the applied torque; wherein the first magnetic field sensor comprises a first 3D-Anisotropic MagnetoResistance (3D-AMR) sensor;

a second magnetic field sensor disposed outside of the shaft, the second magnetic field sensor configured to record a second magnetic field which is generated by the second section of the shaft and which depends on the applied torque; wherein the second magnetic field sensor comprises a second 3D-AMR sensor;

an evaluation circuit configured to:
  receive sensor signals from the first 3D-AMR sensor;
  determine a torque applied to the shaft based on the received sensor signals; and
  compensate measurement value deviations due to a rotational asymmetry of the magnetized sections of the shaft during a rotation of the shaft around its longitudinal axis.

2. The magnetoelastic torque sensor of claim 1, further comprising one or more further magnetized shaft sections with one or more further 3D-AMR sensors.

3. The magnetoelastic torque sensor of claim 1, wherein the first 3D-AMR sensor is held by a plastic holder.

4. The magnetoelastic torque sensor of claim 1, wherein the first 3D-AMR sensor is provided on or in a respective housing.

5. The magnetoelastic torque sensor of claim 1, wherein a magnetic field strength to be measured by the first 3D-AMR sensor is in the range of ±10mT, ±3mT, ±1 mT, ±300μT or ±100μT.

6. The magnetoelastic torque sensor of claim 1, wherein the evaluation circuit is further configured to compensate for the influence of an external interfering magnetic field on the determination of the torque based the signals from the first and second 3D-AMR sensors.

7. The magnetoelastic torque sensor of claim 6, wherein the external interfering magnetic field comprises at least one selected from the group consisting of:

the Earth's magnetic field;

a magnetic field that is generated due to a magnetization of the shaft caused by the Earth's magnetic field;

a magnetic field generated by a permanent magnet in close proximity to the first 3D AMR sensor.

8. The magnetoelastic torque sensor of claim 1, wherein the evaluation circuit comprises a data memory in which a link between the measured magnetic field and the torque applied to the shaft is saved.

9. A device, comprising:

a magnetoelastic torque sensor, the magnetoelastic torque sensor comprising:

a shaft that is magnetized in a first axial section in a first circumferential direction, and to which a torque to be measured can be applied; wherein the shaft has a second axial section that is magnetized in a second circumferential direction that is opposed to the first circumferential direction;

a first magnetic field sensor disposed outside of the shaft, the first magnetic field sensor configured to record a magnetic field which is generated by the first section of the shaft and which is dependent on the applied torque; wherein the first magnetic field sensor comprises a first 3D-Anisotropic MagnetoResistance (3D-AMR) sensor;

a second magnetic field sensor disposed outside of the shaft, the second magnetic field sensor configured to record a second magnetic field which is generated by the second section of the shaft and which depends on the applied torque; wherein the second magnetic field sensor comprises a second 3D-AMR sensor;

an evaluation circuit configured to:
  receive sensor signals from the first 3D-AMR sensor;
  determine a torque applied to the shaft based on the received sensor signals; and
  compensate measurement value deviations due to a rotational asymmetry of the magnetized sections of the shaft during a rotation of the shaft around its longitudinal axis; and wherein the device is a bottom bracket of a bicycle or an e-bike, a motor, a motor test facility, a test facility for high-speed shafts with over 10,000rpm, a gearbox, a robot, an extruder, a straightening machine, a plane, an actuator, a cardan shaft, or a drive shaft.

10. A method for determining a torque applied to a shaft, wherein the shaft is magnetized in a first axial section in a first circumferential direction; wherein the shaft has a second axial section that is magnetized in a second circumferential direction that is opposed to the first circumferential direction; and wherein a first 3D Anisotropic MagnetoResistance (3D-AMR) sensor and a second 3D-AMR sensor are provided, the method comprising:
  applying a torque to the shaft;
  recording, via the first 3D-AMR sensor, a magnetic field generated by the first section of the shaft;
  recording, via the second 3D-AMR sensor, a second magnetic field generated by the second section of the shaft;
  determining the applied torque based on the magnetic field recorded by the first 3D-AMR sensor and the magnetic field recorded by the second 3D-AMR sensor;
  receiving sensor signals from the first 3D-AMR sensor;
  determining a torque applied to the shaft based on the received sensor signals; and
  compensating measurement value deviations due to a rotational asymmetry of the magnetized sections of the shaft during a rotation of the shaft around its longitudinal axis.

11. The method of claim 10, wherein the determining the applied torque comprises a correction of a magnetic field, which is recorded in both the first and second 3D AMR sensors and independent of the torque.

12. The method of claim 11, wherein the correction takes place for each determination of the applied torque in order to perform the correction.

* * * * *